United States Patent [19]

Crivello

[11] 4,193,799

[45] Mar. 18, 1980

[54] METHOD OF MAKING PRINTING PLATES AND PRINTED CIRCUIT

[75] Inventor: James V. Crivello, Clifton Park, N.Y.

[73] Assignee: General Electric Company, Schenectady, N.Y.

[21] Appl. No.: 907,791

[22] Filed: May 19, 1978

Related U.S. Application Data

[60] Division of Ser. No. 732,421, Oct. 14, 1976, abandoned, which is a continuation-in-part of Ser. No. 703,860, Jul. 9, 1976, abandoned.

[51] Int. Cl.$^2$ .......................... G03C 5/00; G03C 1/68
[52] U.S. Cl. ...................................... 430/319; 430/313; 204/159.18; 204/159.2; 430/281; 430/286
[58] Field of Search ............... 96/115 R, 115 P, 35.1, 96/36.2, 86 P; 204/159.18, 159.23, 159.24; 260/2 EP, 2 EC, 47 EC, 47 EN

[56] References Cited

U.S. PATENT DOCUMENTS

| | | | |
|---|---|---|---|
| 3,100,702 | 8/1963 | Rauner et al. | 96/33 |
| 3,552,963 | 1/1971 | Notley et al. | 96/115 R |
| 3,785,821 | 1/1974 | Notley | 96/115 R |
| 3,821,167 | 6/1974 | Asano | 96/115 R |
| 4,026,205 | 5/1977 | Crivello | 96/115 R |
| 4,090,936 | 5/1978 | Barton | 96/115 P |

*Primary Examiner*—Jack P. Brammer
*Attorney, Agent, or Firm*—William A. Teoli; Joseph T. Cohen

[57] ABSTRACT

Curable compositions are provided based on the use of an aromatic onium salt with a blend of epoxy resin and polyvinyl acetal resin. The curable compositions in the form of a cast film can be used directly as a dry film photoresist by being applied to a substrte, such as a copper clad laminate, and cured with ultraviolet light.

2 Claims, No Drawings

METHOD OF MAKING PRINTING PLATES AND PRINTED CIRCUIT

This application is a division of copending application Ser. No. 732,421, filed Oct. 14, 1976, now abandoned which is a continuation-in-part application of copending application Ser. No. 703,860, filed July 9, 1976 now abandoned and assigned to the same assignee as the present invention. The present invention relates to curable compositions useful as or for making dry film photoresist, and insulating coating on various substrates in the cured state.

The curable compositions of the present invention comprise by weight, (A) 0.5% to 98% of epoxy resin,
(B) 0.5% to 98% of polyvinyl acetal,
(C) 0.1% to 10% of aromatic onium salt, and where the sum of (A), (B) and (C) is 100% and (C) is selected from an aromatic halonium salt of the formula, $$[(R)_a(R^1)_bD]_c^+[MQ_d]^{-(d-e)} \quad (1)$$

an aromatic onium salt of a Group Va element of the formula, $$[(R)_f(R^2)_g(R^3)_hE]_c^+[MQ_d]^{-(d-e)} \quad (2)$$

and an aromatic onium salt of a Group VIa element of the formula, $$[(R)_j(R^4)_k(R^5)_mG]_c^+[MQ_d]^{-(d-e)} \quad (3)$$

where R is a monovalent aromatic organic radical, $R^1$ is a divalent aromatic organic radical, $R^2$ and $R^4$ are monovalent organic aliphatic radicals selected from alkyl, cyclo alkyl and substituted alkyl, $R^3$ and $R^5$ are polyvalent organic radicals forming a heterocyclic or fused ring structure with E or G, D is a halogen radical, such as I, E is a Group Va element selected from N, P, As, Sb and Bi, G is a group VIa element selected from S, Se and Te, M is a metal or metalloid, Q is a halogen radical, "a" is a whole number equal to 1 or 2,
"b" is a whole number equal to 0 or 1 and the sum of "a"+"b" is equal to 2 or the valence of D,
"f" is a whole number equal to 0 to 4 inclusive,
"g" is a whole number equal to 0 to 2 inclusive,
"h" is a whole number equal to 0 to 2 inclusive and the sum of "f"+"g"+"h" is a value equal to 4 or the valence of E,
"j" is a whole number equal to 0 to 3 inclusive,
"k" is a whole number equal to 0 to 2 inclusive and
"m" is a whole number equal to 0 or 1, where the sum of "j"+"k"+"m" is a value equal to 3 or the valence of G, $c = d - e$, e is equal to the valence of M and is an integer equal to 2-7 inclusive, and
d>e and is an integer having a value up to 8.

Radicals included by R can be the same or different, aromatic carbocyclic or heterocyclic radicals having from 6 to 20 carbon atoms, which can be substituted with from 1 to 4 monovalent radicals selected from $C_{(1-8)}$ alkoxy, $C_{(1-8)}$ alkyl, nitro, chloro, etc., R is more particularly phenyl, chlorophenyl, nitrophenyl, methoxyphenyl, pyridyl, etc. Radicals included by $R^1$ are divalent radicals, such as

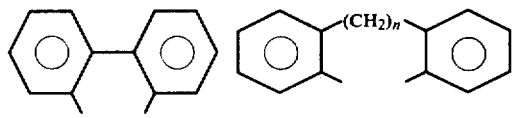

$R^2$ and $R^4$ radicals include $C_{(1-8)}$ alkyl, such as methyl, ethyl, etc., substituted alkyl, such as $-C_2H_4OCH_3$, $-CH_2COOC_2H_5$, $-CH_2COCH_3$, etc. $R^3$ and $R^5$ radicals include such structures as

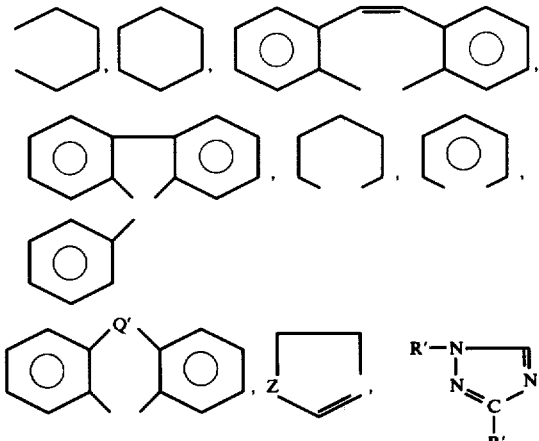

where Q' is selected from O, $CH_2$, N R and S; Z is selected from $-O-$, $-S-$ and

and R' is a monovalent radical selected from hydrogen and hydrocarbon.

Metal or metalloids included by M of formula I are transition metal such as Sb, Fe, Sn, Bi, Al, Ga, In, Ti, Zr, Sc, V, Cr, Mn, Cs, rare earth elements such as the lanthanides, for example, Cd, Pr, Nd, etc., actinides, such as Th, Ta, U, Np, etc., and metalloids such as B, P, As, etc. Complex anions $-(d-e)$ included by $MQ_d^{-(d-e)}$ are, for example, $BF_4^-$, $PF_6^-$, $AsF_6^-$, $SbF_6^-$, $FeCl_4^-$, $SnCl_6^-$, $SbCl_6^-$, $BiCl_5^-$, etc. Halonium salts included by formula 1 are, for example,

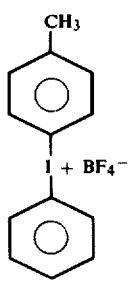 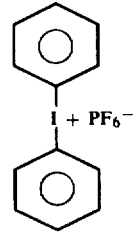

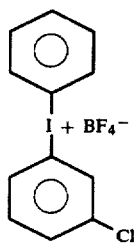 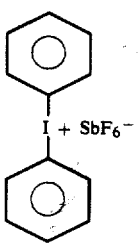
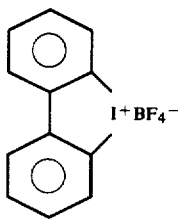
Group Va onium salts included by formula 2 are, for example,
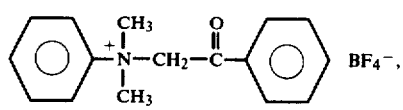
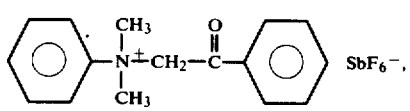
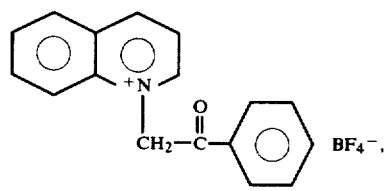
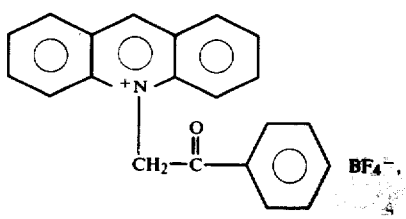
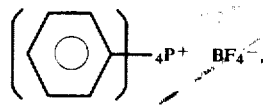
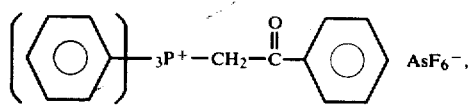
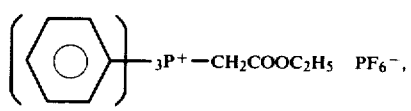
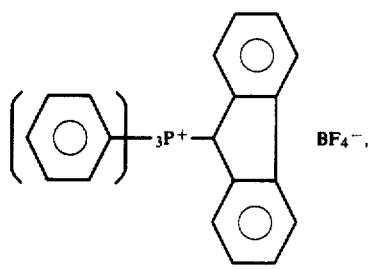
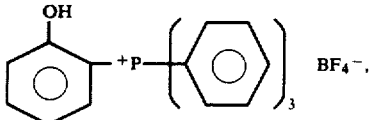
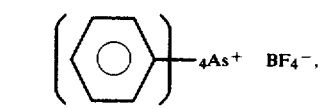
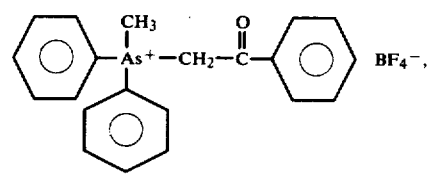
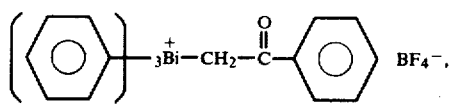
Group VIa onium salts included by formula (1) are, for example,
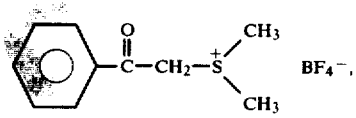
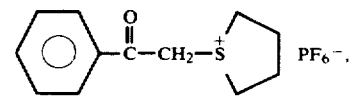
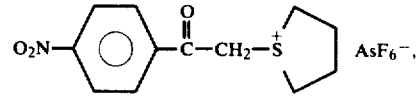
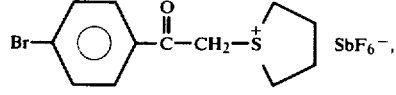
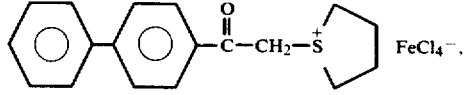
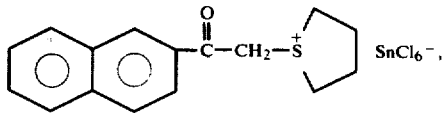

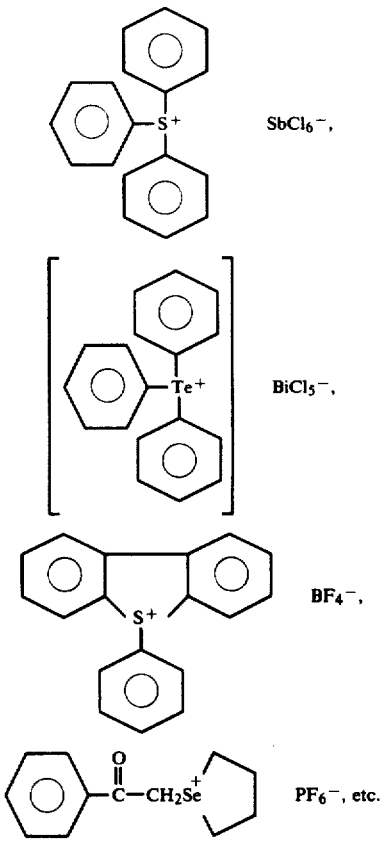

The onium salts of formulas 1-3 can be made by different methods. In formula I, the photoinitiator can be made by effecting contact under aqueous conditions between an arylhalonium bisulfate and the corresponding hexafluoro acid or salt, such as $Y^1MF_6$, where $Y^1$ can be hydrogen, an alkali metal ion, alkaline earth metal ion or transition metal ion.

In addition to the above-described metathesis for making the correspondng halonium salts, the halonium salts of the present invention, also can be prepared by using silver compounds such as silver oxide, or silver tetrafluoroborate, which were reacted with the appropriate diarylhalonium salt, as shown by M. C. Caserio et al., J. Am. Chem. Soc. 81, 336 (1959) or M. C. Beringer et al., J. Am. Chem. Soc. 81, 342 (1959). Methods for making Group VIa compounds, such as sulfonium, selenium and tellurium compounds can be made by procedures shown in J. W. Knapczyk and W. E. Mc-Ewen, J. Am. Chem. Soc., 91 145, (1969); A. L. Maycock and G. A. Berchtold, J. Org. Chem., 5 35 No. 8,2532 (1970); H. M. Pitt, U.S. Patent 2,807,648, E. Goethals and P. De Radzetzky, Bul. Soc. Chim. Belg., 73 546 (1964); H. M. Leichester and F. W. Bergstrom, J. Am. Chem. Soc., 51 3587 (1929), etc.

Among the procedures which can be used to make Group Va onium salts, arsonium, antimonium and bismuthonium salt can be found in Goerdel, Methoden der Organishen Chimie 11/2, 591–640 (1958) and K. Sasse, idid, 12/1 79–112 (1963).

The term "epoxy resin" as utilized in the description of the curable compositions of the present invention, includes any monomeric, dimeric or oligomeric or polymeric epoxy material containing one or a plurality of epoxy functional groups. For example, those resins which result from the reaction of bisphenol-A (4,4'-isopropylidenediphenol) and epichlorohydrin, or by the reaction of low molecular weight phenol-formaldehyde resins (Novalak resins) with epichlorohydrin, can be used alone or in combination with an epoxy containing compound as a reactive diluent. Such diluents as phenyl glycidyl ether, 4-vinylcyclohexane dioxide, limonene dioxide, 1,2-cyclohexane oxide, glycidyl acrylate, glycidyl methacrylate, styrene, oxide, allyl glycidyl ether, etc., may be added as viscosity modifying agents.

In addition, the range of these compounds can be extended to include polymeric materials containing terminal or pendant epoxy groups. Examples of these compounds are vinyl copolymers containing glycidyl acrylate or methacrylate as one of the comonomers. Other classes of epoxy containing polymers amenable to cure using the above catalysts are epoxy-siloxane resins, epoxy-polyurethanes and epoxy-polyesters. Such polymers usually have epoxy functional groups at the ends of their chains. Epoxy-siloxane resins and method for making are more particularly shown by E. P. Plueddemann and G. Fanger, J. Am. Chem. Soc. 80 632-5 (1959). As described in the literature, epoxy resins can also be modified in a number of standard ways such as reactions with amines, carboxylic acids, thiols, phenols, alcohols, etc., as shown in U.S. Pat. Nos. 2,935,488; 3,235,620; 3,369,055; 3,379,653; 3,398,211; 3,403,199; 3,563,850; 3,567,797; 3,677,995; etc. Further examples of epoxy resins which can be used are shown in the Encyclopedia of polymer science and technology, Vol. 6, 1967, Interscience Publishers, New York, pp 209,271.

The polyvinyl acetals which can be used in the curable compositions of the present invention can be mixtures of units, e.g.,

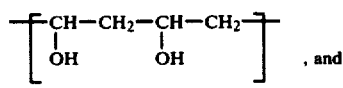, and

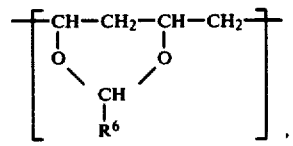, chemically combined with

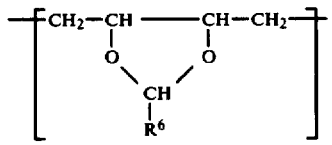

where the polymers can have an average of from about 5 to 5000 units and $R^6$ is selected from hydrogen, $C_{(1-8)}$ alkyl, such as methyl, ethyl, butyl and mixtures thereof. Additional polyvinyl acetals which can be used in the practice of the invention are shown in the Encyclopedia of Polymer Science and Technology, H. F. Mark and N. G. Gaylord, Vol. 14, 149 (1971).

The curable compositions of the present invention can be cast from organic solvent solutions to produce dry film photoresists. Suitable organic solvents which can be employed include, for example, methylene chloride, chloroform, methyl ethyl ketone, cellosolve acetate, tetrahydrofuran, acetonitrile, etc., at from 0 to 80% by weight of the curable composition. The curable compositions can be heat cured at temperatures of from 100° C. to 200° C. If desired, as shown in my copending application Ser. No. 689,247, filed May 24, 1976 now abandoned assigned to the same assignee as the present invention, 0.5% to 10% by weight of a reducing agent can be added to the curable compositions in order to facilitate the heat cure of the curable composition particularly when employed to make insulating coating on aluminum and copper conductors.

Preferably, the curable compositions of the present invention can be converted to the solvent resistant state when exposed to ultraviolet light as cast films. When used as dry film photoresist, the film can be patterned with a mask using UV irradiation having a wavelength of from 1849 Å. to 4000 Å and an intensity of at least 5,000–80,000 microwatts per $cm^2$. The lamp systems used to generate such radiation can consist of ultraviolet lamps such as from 1 to 50 discharge lamps, for example, xenon, metallic halide, metallic arc, such as a low, medium or high pressure mercury vapor discharge lamp, etc., having an operating pressure of from a few millimeters to about 10 atmospheres, etc., can be employed. The lamps can include envelopes of transmitting light of a wavelength of from about 1849 Å. to 4000 Å., and preferably 2400 Å. to 4000 Å. The lamp envelope can consist of quartz, such as Spectrocil, or of Pyrex, etc. Typical lamps which can be employed for providing ultraviolet radiation are, for example, medium pressure mercury arcs, such as the GE HT37 arc and the Hanovia 450 W arc lamp. The cures may be carried out with a combination of various lamps, some of all of which can operate in an inert atmosphere. When using UV lamps, the irradiation flux on the substrate can be at least 0.01 watts per square inch to effect cure of the dry film photoresist.

The curable compositions may contain inactive ingredients, such as inorganic fillers, dyes, pigments, extenders, viscosity control agents, process aids, UV-screens, etc., in amounts of up to 100 parts filler per 100 of epoxy resin. The curable compositions can be applied to such substrates as metal, rubber, plastic, molded parts of films, paper, wood, glass, cloth, concrete, ceramic, etc.

In order that those skilled in the art will be better able to practice the invention, the following examples are given by way of illustration and not by way of limitation. All parts are by weight.

EXAMPLE 1

A solution of 10 parts of polyvinylformal (Monsanto Formvar 12/85), 2.5 parts of Ciba-Geigy Araldite ECN1299 cresol-novalac epoxy resin, 0.3 part of triphenylsulfonium hexafluoroantimonate, and about 80 parts of chloroform was cast as a 5 mil film onto a glass plate. The film was removed and exposed through a glass contact mask to ultraviolet light from a GE HT37 medium pressure mercury arc lamp for 3 minutes at a distance of 6 inches. After irradiation, a visible image was observed in the film. The latent image was developed by immersing the film in chloroform. A clear upraised negative image of the mask in the film resulted.

EXAMPLE 2

A solution was prepared consisting of 10 parts of Formvar 15/95E polyvinylformal, 5 parts of the epoxy resin of Example 1 (ECN 1299), 0.3 part of triphenyl sulfonium hexafluoroantimonate, 80 parts of methylene chloride was cast as a 5 mil film onto a polyethylene terephthalate substrate. A contact mask was then placed on top of the resulting composite, which was then exposed for 3 minutes under ultraviolet light as described in Example 1. The resulting composite was then developed by immersing it in 2-ethoxyethylacetate. There was obtained a polyethylene terephthalate substrate having a negative image of the mask on its surface, which was useful as a printing plate.

EXAMPLE 3

A curable composition was prepared by dissolving 10 parts of Formvar 15/95E, 0.3 part of triphenylsulfonium hexafluoroarsenate and 5 parts of Araldite ECN 1299 and about 80 parts of methylene chloride. The resulting solution was then cast onto a glass plate. A translucent film was obtained from the resulting solution upon evaporation of the solvent. The film was then removed from the glass substrate and placed in contact with a mask. The film was then irradiated as described in Example 1, for a period of about 1.5 minutes. The film was then heated in an oven at 100° C. for 5 minutes. There was obtained a clear negative reproduction of the mask when the film was developed using chloroform.

EXAMPLE 4

A film was cast onto a glass plate of a curable composition consisting of 10 parts of the reaction product of polyvinyl alcohol and butyraldehyde (Butvar B-74), 2.5 parts of Araldite ECN 1299, 0.3 part of triphenylsulfonium hexafluoro arsenate and about 90 parts of methylene chloride. The film was removed from the glass plate and then laminated onto a copper-clad epoxy-glass circuit board at 130° C. under pressure. The laminated board was then exposed to ultraviolet light as in Example 1, using a contact mask. The laminate was then developed using chloroform to produce a negative image of the curable resin on copper. The copper laminate was then etched using ferric chloride. There was obtained a copper-clad laminate having a positive image of the mask in copper on the surface of the epoxy glass substrate.

EXAMPLE 5

A curable composition was prepared as described in Example 4, except there was employed triphenyl sulfonium hexafluoroantimonate as the photoinitiator and there was utilized in the composition 0.1 part of Dayglo T-13 pigment. A film was cast onto a sheet of polyethyleneterephthalate. After the film dried, it was covered with a contact mask and exposed to ultraviolet light as described in Example 1. The irradiated photosensitive film-polyethyleneterephthalate composite was then contacted to plain white paper and heated to 130° C. under pressure. There was obtained a clear negative image of the mask on the white paper. It was found that the composite could be used to transfer sharp negative images of the mask to several additional pieces of paper following the same procedure.

Based on the above results, the curable compositions of the present invention can be employed as dry film photoresist to produce printing plates, copper-clad laminates, etc.

As shown in my copending application Ser. No. 574,005, filed May 2, 1975 now U.S. Pat. No. 4,026,705 and assigned to the same assignee as the present invention, visible light curable compositions are described, based on the use of diarylhalonium salts in combination with certain organic dyes as a photoinitiator for epoxy resins. Such visible light photoinitiators also can be used in the practice of the present invention as shown by the following example.

EXAMPLE 6

A methylene chloride solution was cast onto a Mylar film, consisting of 10 parts of Formvar 15/95E, 2.5 parts of Araldite ECN 1299, 0.3 part of diphenyliodonium hexafluoroarsenate, 0.1 part of benzoflavin and about 80 parts of methylene chloride. When the film was dry it was subjected to image-wise exposure using a GE 375W photoflood lamp, which is a visible light source. Irradiation for 5 minutes produced a clear image in the film. The latent image was developed using chloroform, 2-ethoxyethyleacetate or methylene chloride, resulting in a clear upraised reproduction of the mask.

The above procedure was repeated except that in place of benzoflavin, there was used acridine orange. In addition, a third film was cast using phosphene-R dye in place of the benzoflavin. It was found that substantially equivalent results were obtained with each of the aforementioned dyes, which were substituted for benzoflavin.

A curable composition was prepared as described above in which Formvar 15/95E was substituted with an equivalent weight of ethylcellulose. A film was cast from this mixture and subjected to image-wise exposure using a contact mask. It was found that the resulting film dissolved completely in chloroform when development of the film was attempted. This indicated that no cross-linking had occurred in the absence of the polyvinylacetal which was required to make a dry film photoresist.

In addition to the above shown dyes employed in the visible light curable compositions of the present invention, other dyes which can be used in combination with the diphenyliodonium salts, used in the practice of the invention, are cationic dyes, such as shown in volume 20, page 194-7 of the Kirk-Othmer Encyclopedia, second edition 1965, John Wiley & Sons, New York. In addition to the aforementioned cationic dyes, basic dyes also can be used which are shown in volume 7, pages 532-4 of the Kirk-Othmer Encyclopedia as cited above. Some of the cationic dyes which can be used are, for example, Acridine orange C.I. 46005
Acridine yellow C.I. 46025
Setoflavin T C.I. 49005. In addition, some of the basic dyes which can be used are, for example,
Haematoporphyrin
4,4'-bisdimethylaminobenzophenone
4,4'-bisdiethylaminobenzophenone, etc.

Although the above examples are limited to only a few of the very many variables out of which the compositions of the present invention can be made, it should be understood that the compositions of the present invention are broadly directed to the use of epoxy resin, polyvinylacetals and onium salt which are more particularly defined in the description preceding these examples.

What I claim as new and desire to secure by Letters Patent of the United States is:

1. A method for making a circuit board which comprises (1) contacting a film made by casting a solution of a curable composition to a copper clad laminate to produce a composite structure, where the curable composition comprises by weight
  (A) 0.5% to 98% of epoxy resin,
  (B) 0.5% to 98% of polyvinyl acetal,
  (C) 0.1% to 10% of aromatic onium salt, where the sum of (A), (B) and (C) is 100% and (C) is selected from an aromatic halonium salt or mixtures thereof of the formula

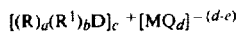

an aromatic onium salt of a Group Va element of the formula,

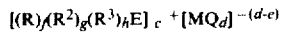

and an aromatic onium salt of a Group VIa element of the formula,

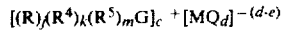

(2) placing a contract mask onto the cast film of the composite structure of (1),
(3) exposing the composite structure of ultraviolet light to effect the cure of exposed areas of the cast film of the composite structure of (1),
(4) developing the resulting exposed composite structure of (1) to produce a copper-clad laminate protected by a negative photoresist of the contact mask in (2),
(5) etching the copper-clad laminate to effect the removal of exposed areas of copper therefrom, and
(6) removing the negative photoresist from the resulting copper-clad laminate to produce a circuit board comprised of copper patterned as a positive image of the mask used in (2), where R is a monovalent aromatic organic radical, $R^1$ is a divalent aromatic organic radical, $R^2$ and $R^4$ are monovalent organic aliphatic radicals selected from alkyl, cyclo alkyl and substituted alkyl, $R^3$ and $R^5$ are polyvalent organic radicals selected from aliphatic radicals and aromatic radicals forming a heterocyclic or fused ring structure with E or G, E is a Group Va element selected from N, P, As, Sb and Bi, G is a group VIa element selected from S, Se and Te, M is a metal or metalloid, Q is a halogen radical, "a" is a whole number equal to 0 or 2,
"b" is a whole number equal to 0 or 1, and the sum of "a"+"b" is equal to 2 or the valence of D,
"f" is a whole number equal to 0 to 4 inclusive,
"g" is a whole number equal to 0 to 2 inclusive,
"h" is a whole number equal to 0 to 2 inclusive and the sum of "f"+"g"+"h" is a value equal to 4 or the valence of E,
"j" is a whole number equal to 0 to 3 inclusive,
"k" is a whole number equal to 0 to 2 inclusive, and
"m" is a whole number equal to 0 or 1, where the sum of "j"+"k"+"m" is a value equal to 3 or the valence of G, $c = d - e$, e is equal to the valence of M and is an integer equal to 2-7 inclusive, and $d > e$ and is an integer having a value up to 8.

2. A method for making a printing plate which comprises, (1) contacting a mask to a film made by casting onto a substrate a curable composition comprising by weight
  (A) 0.5% to 98% of epoxy resin,
  (B) 0.5% to 98% of polyvinyl acetal,
  (C) 0.1% to 10% of an aromatic onium salt,
where the sum of (A), (B) and (C) is 100% and (C) is selected from an aromatic halonium salt of the formula, $$[(R)_a(R^1)_bD]_c{}^+[MQ_d]^{-(d-e)},$$

an aromatic onium salt of a Group Va element of the formula, $$[(R)_f(R^2)_g(R^3)_hE]_c{}^+[MQ_d]^{-(d-e)},$$

and an aromatic onium salt of a Group VIa element of the formula, $$[(R)_j(R^4)_k(R^5)_mG]_c{}^+[MQ_d]^{-(d-e)},$$

(2) exposing the resulting composite structure of (1) to ultraviolet light to effect the cure of exposed areas of the cast film, and
(3) developing the resulting film to produce a raised image of the mask of (1),
where R is a monovalent aromatic organic radical, $R^1$ is a divalent aromatic organic radical, $R^2$ and $R^4$ are monovalent organic aliphatic radicals selected from alkyl, cyclo alkyl and substituted alkyl, $R^3$ and $R^5$ are polyvalent organic radicals selected from aliphatic radicals and aromatic radicals forming a heterocyclic or fused ring structure with E or G, E is a Group Va element selected from N, P, As, Sb and Bi, G is a group VIa element selected from S, Se and Te, M is a metal or metalloid, Q is a halogen radical, "a" is a whole number equal to 0 or 2,
"b" is a whole number equal to 0 or 1, and the sum of "a"+"b" is equal to 2 or the valence of D,
"f" is a whole number equal to 0 to 4 inclusive,
"g" is a whole number equal to 0 to 2 inclusive,
"h" is a whole number equal to 0 to 2 inclusive, and the sum of "f"+"g"+"h" is a value equal to 4 or the valence of E,
"j" is a whole number equal to 0 to 3 inclusive,
"k" is a whole number equal to 0 to 2 inclusive, and
"m" is a whole number equal to 0 or 1, where the sum of "j"+"k"+"m" is a value equal to 3 or the valence of G, $c = -e,$ e is equal to the valence of M and is an integer equal to 2–7 inclusive, and
$d > e$ and is an integer having a value up to 8.

* * * * *